United States Patent
Lefevre

(10) Patent No.: US 11,448,678 B2
(45) Date of Patent: Sep. 20, 2022

(54) POLYPHASE INDUCTIVE FILTER

(71) Applicant: Commissariat à l'Énergie Atomique et aux Énergies Alternatives, Paris (FR)

(72) Inventor: Guillaume Lefevre, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 2 days.

(21) Appl. No.: 16/732,991

(22) Filed: Jan. 2, 2020

(65) Prior Publication Data
US 2020/0217881 A1  Jul. 9, 2020

(30) Foreign Application Priority Data

Jan. 4, 2019 (FR) ..................... 19/00095

(51) Int. Cl.
G01R 29/20 (2006.01)
G01R 31/62 (2020.01)
G01R 35/02 (2006.01)
H01F 27/28 (2006.01)
H02M 3/335 (2006.01)

(52) U.S. Cl.
CPC ............. *G01R 29/20* (2013.01); *G01R 31/62* (2020.01); *G01R 35/02* (2013.01); *H01F 27/2804* (2013.01); *H02M 3/33576* (2013.01)

(58) Field of Classification Search
CPC ........ G01R 29/20; G01R 31/62; G01R 35/02; H01F 27/2804; H01F 17/0006; H02M 3/33576; H02M 3/003; H02M 1/0064; H02M 3/1586; H02M 1/14

USPC ....................................................... 324/547
See application file for complete search history.

(56) References Cited

U.S. PATENT DOCUMENTS

| | | | |
|---|---|---|---|
| 2003/0080847 A1* | 5/2003 | Radzelovage | H01F 38/30 336/229 |
| 2009/0273428 A1 | 11/2009 | Chen | |
| 2019/0348213 A1* | 11/2019 | Ikarashi | H01F 27/24 |

FOREIGN PATENT DOCUMENTS

| | | |
|---|---|---|
| EP | 0 028 971 A1 | 5/1981 |
| FR | 1900095 | 11/2019 |

OTHER PUBLICATIONS

Corney, A. C. "A simple traceable current transformer calibration method." Conference on Precision Electromagnetic Measurements. Conference Digest. CPEM 2000 (Cat. No. 00CH37031). IEEE, 2000. (Year: 2000).*
Pejtersen, Jens, and Arnold Knott. "Design and measurement of planar toroidal transformers for very high frequency power applications." Proceedings of The 7th International Power Electronics and Motion Control Conference. vol. 1. IEEE, 2012. (Year: 2012).*
Zhu, H. P., et al. "A hybrid active power compensation device for current balance of electrical railway system." 2010 International Conference on Power System Technology. IEEE, 2010. (Year: 2010).*

(Continued)

*Primary Examiner* — Christopher P McAndrew
(74) *Attorney, Agent, or Firm* — Wolf, Greenfield & Sacks, P.C.

(57) ABSTRACT

A device including at least two transformers, wherein: each winding of a transformer is electrically in series with a winding of another transformer, and the transformers have a transformation ratio different from one.

14 Claims, 3 Drawing Sheets

(56) References Cited

OTHER PUBLICATIONS

Cuk, Slobodan, and R. D. Middlebrook. "Advances in switched-mode power conversion part II." IEEE Transactions on Industrial Electronics 1 (1983): 19-29. (Year: 1983).*
Preliminary Search Report for French Application No. FR1900095, dated Nov. 22, 2019.
Kroics et al., Digitally controlled 4-phase interleaved DC-DC converter with coupled inductors for storage application in microgrid. 2015 IEEE 9th International Conference on Compatibility and Power Electronics (CPE). Jun. 24, 2015:504-9.
Pan et al., Research on high power interleaved bidirectional dc-dc converter with coupling technique. 2017 IEEE Transportation Electrification Conference and Expo, Asia-Pacific (ITEC Asia-Pacific). Aug. 7, 2017:1-6.

* cited by examiner

POLYPHASE INDUCTIVE FILTER

This application claims the priority benefit of French patent application number 19/00095, the content of which is hereby incorporated by reference in its entirety to the maximum extent allowable by law.

TECHNICAL BACKGROUND

The present disclosure generally concerns electronic circuits, in particular inductive elements used, in particular, in converters.

PRIOR ART

A converter enables to deliver, from power generated by a source, current and/or voltage levels compatible with an application. Such a converter is often of switched-mode type, that is, where alternated switch turn-off and turn-on operations are repeated. The off and on times are controlled to regulate the voltage and/or the current generated by the converter. Inductive elements enable to limit the current and/or voltage variations generated by such repeated turn-off and turn-on operations.

SUMMARY

An embodiment overcomes all or part of the disadvantages of known converters.

An embodiment overcomes all or part of the disadvantages of known inductive elements.

An embodiment provides a device comprising at least two transformers, wherein: each winding of a transformer is electrically in series with a winding of another transformer; and the transformers have a transformation ratio different from one.

According to an embodiment, at least two windings of a same transformer have different numbers of spirals.

According to an embodiment, the coupling coefficient of each transformer is greater than 0.9.

According to an embodiment, the phase points of the windings are opposite.

According to an embodiment, the device comprises at least two paths, each of which comprises at least two windings in series of different transformers.

According to an embodiment, the phase points of at least two windings of a same path are opposite.

According to an embodiment, the number of transformers is equal to the number of paths.

According to an embodiment, the number of windings in series per path is equal to the number of windings per transformer.

According to an embodiment, each path represents a phase of an AC voltage.

According to an embodiment, each transformer comprises a toroidal magnetic circuit.

According to an embodiment, the device comprises a PCB-type substrate having magnetic circuits of the transformers included therein.

According to an embodiment, said windings are each defined by conductive tracks located on the opposite surface of the substrate and series-coupled by vias.

A polyphase inductive filter, comprising a device such as defined hereabove.

A switched-mode converter, comprising at least one device such as defined hereabove.

The foregoing and other features and advantages will be discussed in detail in the following non-limiting description of specific embodiments in connection with the accompanying drawings.

DESCRIPTION OF THE EMBODIMENTS

Figure 1:
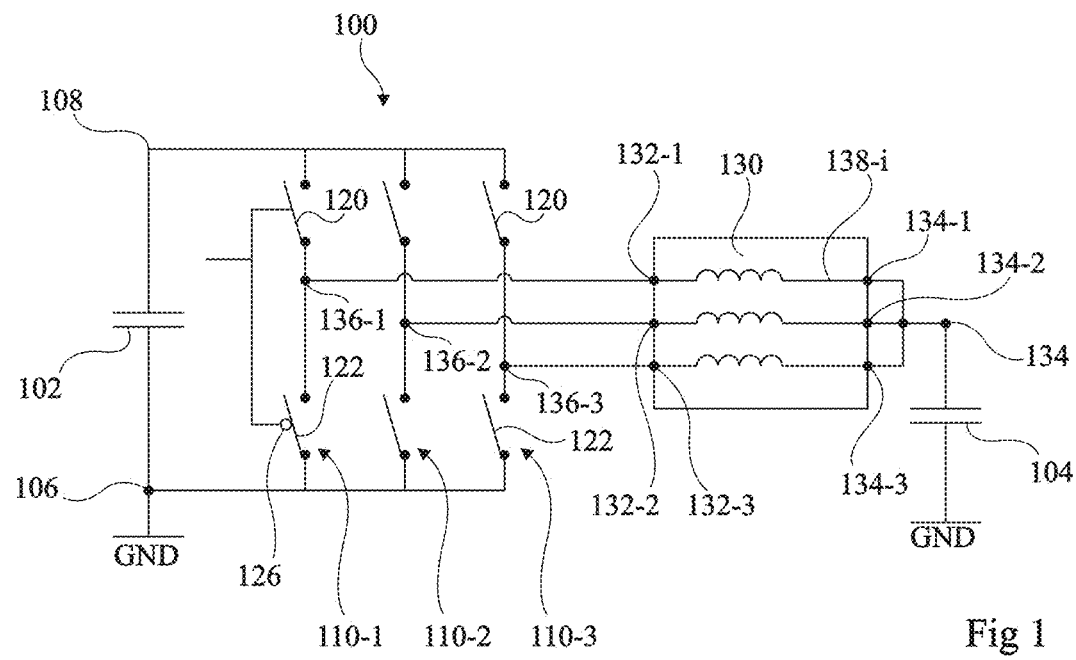
FIG. 1 schematically shows an example of a converter to which the described embodiments apply.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

FIG. 1 schematically shows an example of a converter 100 to which the described embodiments apply.

In this example, converter 100 is a buck converter. Converter 100 comprises an input capacitor 102 and an output capacitor 104. Capacitor 102 is connected between 2 input nodes 106 and 108 of converter 100, which receive electric power from a source, not shown. In this example, node 106 is a node of application of a reference potential, such as ground GND. Capacitor 104 is connected in parallel with a load, not shown.

The converter comprises a plurality of branches 110_i in parallel between nodes 106 and 108, wherein index i is an integer between 1 and N. In the shown example, number N is equal to 3, and converter 100 thus comprises three branches 110_1, 110_2, and 110_3. Each branch comprises two switches 120 and 122 electrically coupled in series, preferably series-connected. Switches 120 and 122 for example each comprise one or a plurality of transistors.

In each branch 110_i, switches 120 and 122 are controlled to avoid a simultaneous conduction of the two switches in the branch. In simplified fashion, the two switches of a same branch receive complementary control signals. In operation, switch 120 is off when switch 122 is on, and switch 122 is off when switch 122 is on. This is for example obtained by using transistors of the same type and by inverting the control signal, for example, with an inverter 126, for a single one of switches 120 and 122. As a variation, the switch 122 of each branch, located on the ground side, is a diode, and its turning off and its turning on are obtained with no active control.

In each branch 110_i, switches 120 and 122 are controlled in pulse width modulation, PWM, that is, turn-off and turn-on operations are repeated for each switch at a given frequency, called switching frequency, or in PFM ("Pulse Frequency Modulation"), that is, by varying the switching frequency.

Branches 110_i are controlled at the same switching frequency. Branches 110_i are typically controlled by interlaced control signals, that is, phase-shifted with respect to one another. Preferably, the phase shifts between branches are regularly distributed between 0 and 360 degrees.

Converter 100 comprises an inductive filter 130 coupling branches 110_i to output capacitor 104. Inductive filter 130 has nodes, or terminals, 132_i (132_1, 132_2, 132_3, on the left-hand side), and nodes, or terminals, 134_i (134_1, 134_2, 134_3, on the right-hand side). Nodes 132_i are respectively connected to branches 110_i. More precisely, branches 110_i each have a midpoint 136_i (136_1, 136_2, 136_3) which connects switches 120 and 122 together, and nodes 136_i are coupled, preferably connected, respectively to nodes 132_i. Nodes 134_i are coupled together to an electrode 134 of capacitor 104. The other electrode of capacitor 104 is for example coupled to ground GND.

Filter 130 comprises connecting parts 138_i, or paths, coupling nodes 132_i respectively to nodes 134_i. In the shown example, filter 130 is three-phased, that is, it comprises three paths. Links 138_i are inductive and preferably electrically insulated from one another.

In operation, polyphase filter 130 enables to dampen current variations in each path. Nodes 136_i then deliver AC potential values having with respect to one another phase-shifts uniformly distributed between 0 and 360 degrees, called phases of a polyphase AC voltage.

Polyphase inductive filters are also used in other types of converter than that discussed hereabove. For example, capacitor 104 may receive power from a source, and capacitor 102 may be connected in parallel with a load. The converter is then of boost type. Filter 130 enables to limit the current flowing between capacitor 104 and the switched load formed by branches 110_i and capacitor 102.

The use of polyphase inductive filters is not limited to the above converters. In particular, the converter branches may be replaced with any source delivering, onto nodes 132_i, AC voltages having phase shifts with respect to one another. Output capacitor 104 may for example be replaced with a plurality of capacitive loads respectively coupled to nodes 134_i.

For example, in certain applications, a plurality of converters generating and/or receiving AC voltages at a frequency smaller than the switching frequencies of the converters are used. One or a plurality of inductive filters between these converters and one or a plurality of loads receiving the AC voltages delivered by the converters may then be used. One or a plurality of inductive filters between the converters and one of the sources powering the converters may also be used.

Figure 2:
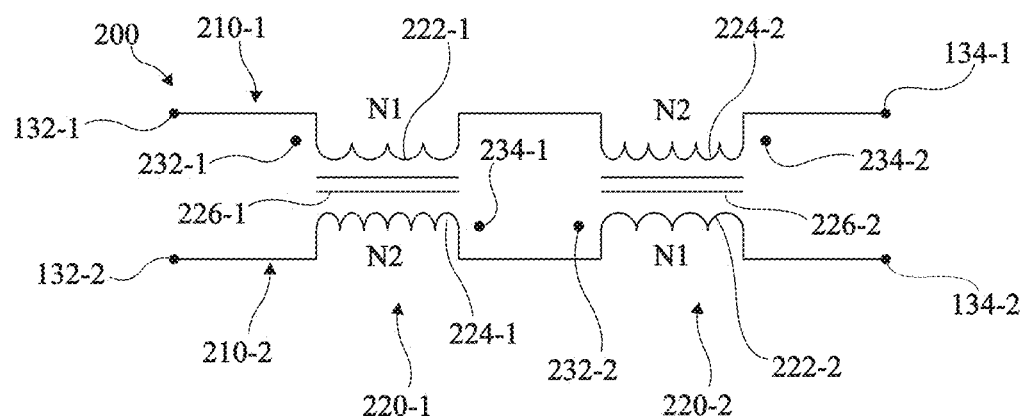
FIG. 2 schematically shows an embodiment of an inductive filter.

FIG. 2 schematically shows an embodiment of an inductive filter 200. In this embodiment, the inductive filter comprises two paths 210_1 and 210_2. Inductive filter 200 may be used instead of the filter 130 of a converter with two branches of the type described in relation with FIG. 1. Path 210_1 couples together nodes or terminals 132_1 and 134_1, and path 210_2 couples together nodes or terminals 132_2 and 134_2.

Filter 200 comprises a transformer 220_1, comprising windings 222_1 and 224_1, and a transformer 220_2 comprising windings 222_2 and 224_2. In each transformer 220_1, 220_2, the two windings are magnetically coupled to each other by respective magnetic circuits 226_1 and 226_2. Path 210_1 comprises two windings 222_1 and 224_2 electrically in series, each belonging to one of transformers 220_1 and 220_2. Winding 222_1 is for example on the side of node 132_1. Path 210_2 comprises two windings 224_1 and 222_2 electrically in series, each belonging to one of transformers 220_1 and 220_2. Winding 224_1 is for example on the side of node 132_2. Thus, each transformer comprises a winding of path 210_1, and a winding of path 210_2. Each winding of a transformer is electrically in series with a winding of the other transformer.

Transformers 220_1 and 220_2 thus magnetically couple paths 210_1 and 210_2. This magnetic coupling or mutual coupling enables, for example, in the case of a converter with two branches, filter 200 to decrease the amplitude of the variations of the current flowing through the converter switches with respect to a filter where each path would have an inductance non-coupled to the inductances of the other paths.

Transformers 220_1 and 220_2 have transformation ratios different from 1, for example, plus or minus 5%, preferably plus or minus 10%. In each transformer 220_1, 220_2, the transformation ratio between winding 222_1, 222_2 and winding 224_1, 224_2 is defined by the ratio of the number of turns or spirals of winding 224_1, 224_2 to the number of turns or spirals of winding 222_1, 222_2.

Due to the fact that the transformation ratios are different from 1, paths 210_1 and 210_2 are less magnetically coupled than if the transformation ratios were equal to 1. The risk for the magnetic coupling to be too strong between paths is thus avoided. Indeed, too strong a coupling would result in losing the advantage relative to magnetic coupling current variations between paths. By limiting the magnetic coupling, for example, to a magnetic coupling coefficient between paths in the range from 0.5 to 0.9, for example, smaller than 0.8, one benefits from the filtering of current variations due to the magnetic coupling between paths. In particular, the transformation ratios are selected to obtain a minimum current variation amplitude, for example, when the filter is used in a converter with two branches of the type described in relation with FIG. 1. For this purpose, the transformation ratios are for example greater than 2 or smaller than 0.5, preferably greater than 3 or smaller than ⅓, preferably greater than 5 or smaller than ⅕. An optimal value of the coupling between paths is thus obtained. Preferably, a primary winding and a secondary winding are defined in each transformer. For example, the primary windings are windings 222_1 and 222_2 located in different paths. The transformation ratios are then defined between the primary winding and the secondary winding, and are preferably smaller than 1.

Preferably, the transformation ratio between winding 222_1 and winding 224_1 is the same as the transformation ratio between winding 222_2 and winding 224_2. The inductances of paths 210_1 and 210_2 are then equal. A balanced operation of the branches is obtained, for example, in the case of a use of the filter in a converter with two branches. Preferably, windings 222_1 and 222_2 have a same number N1 of turns, and windings 224_1 and 224_2 have a same number N2 of turns.

Preferably, each transformer 220_1, 220_2, exhibits a strong magnetic coupling between its windings, for example, each transformer 220_1, 220_2 has a coupling coefficient greater than 0.9, preferably greater than 0.95.

Such transformers with a strong magnetic coupling are easier to form and to size than transformers with a lighter magnetic coupling. In particular, the stronger the coupling, the more bulky the transformer. Further, magnetic circuits 226_1 and 226_2 may advantageously be toroidal magnetic circuits. Further, transformers with a strong magnetic coupling have less magnetic field leakage than transformers where a lighter magnetic coupling would be obtained by providing a magnetic field leakage. Parasitic electromagnetic emissions emitted by the filter are thus decreased. Also, the minimizing of magnetic field leakage goes along with an optimization of high-frequency copper losses, which eases the sizing of the transformers.

Preferably, transformer 220_1 has one of its phase points, or winding direction detection point, (phase point 234_1 of winding 224_1 in the shown example) located on the side of transformer 220_2, and the other one of its phase points (phase point 232_1 of winding 222_1 in the shown example) located on the side opposite to transformer 220_2. Similarly, transformer 220_2 has one of its phase points, 232_2, located on the side of transformer 220_1, and the other one of its phase points, 234_2, located on the side opposite to transformer 220_1. Thus, preferably, the phase points of at least two windings of a same path are opposite. In other words, currents flowing in winding 222_1 towards winding 224_2 and in winding 224_1 towards winding 222_2 cause magnetic flows of opposite directions in magnetic circuit 226_1. Similarly, current flowing in windings 224_2 and 222_2, heading towards respectively windings 222_1 and 224_1, cause magnetic flows of opposite directions in magnetic circuit 226_2. This enables to obtain a magnetic coupling direction optimizing the decrease of current variations in the paths.

Figure 3:
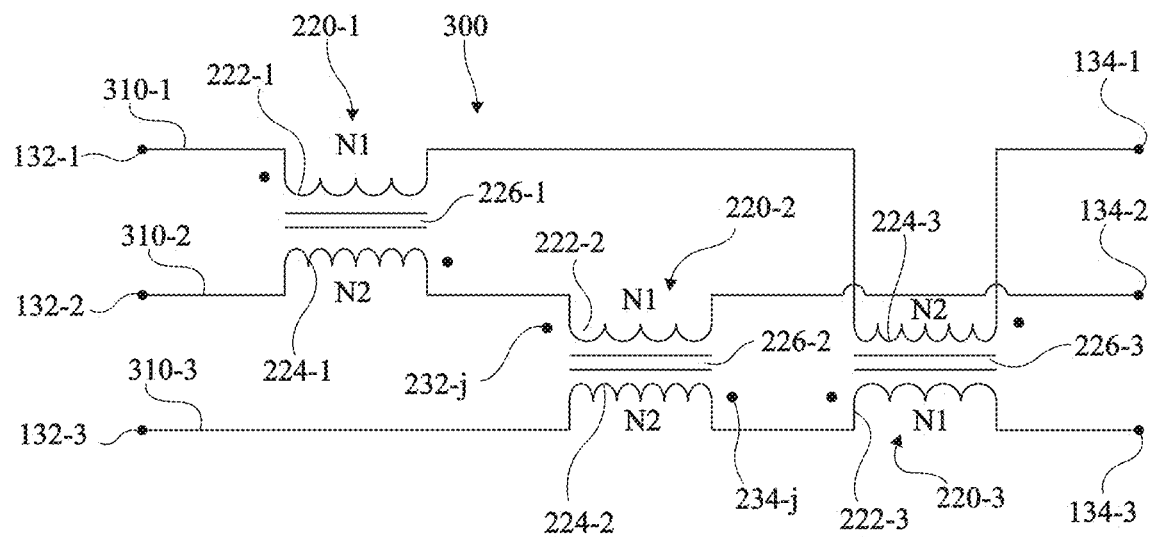
FIG. 3 schematically shows another embodiment of an inductive filter.

FIG. 3 schematically illustrates another embodiment of a polyphase inductive filter 300.

Filter 300 for example comprises a number N of paths 310_i. Number N of paths is for example the same as that of the branches of a converter where the filter is intended to be used. Each path 310_i couples a node 132_i to a node 134_i. As an example, the case of three paths 310_1, 310_2, and 310_3, coupling the respective nodes 132_1, 132_2, and 132_3, to respective nodes 134_1, 134_2, and 134_3 has been shown.

Filter 300 comprises transformers 220_j, preferably in a number equal to number N of paths, index j then being an integer in the range from 1 to N. Thus, the shown device comprises three transformers 220_1, 220_2, and 220_3. Transformers 220_j are identical or similar to transformers 220_1 and 220_2 of FIG. 2. Each particular, each transformer comprises two windings 222_j (222_1, 222_2, and 222_3) and 224_j (224_1, 224_2, and 224_3), and a magnetic circuit 226_j (226_1, 226_2, and 226_3) magnetically coupling windings 222_j and 224_j to each other. Each winding of a transformer is electrically in series with a winding of another one of the transformers.

The transformation ratios of transformers 220_j are different from 1. Preferably, transformers 220_j have, between their respective windings 222_j and 224_j, identical transformation ratios, for example, of same value as that of transformers 220_1 and 220_2 of FIG. 2.

Each path 310_i comprises, electrically in series, a winding 222_j of one of transformers 220_j and a winding 224_j located in another one of transformers 220_j. In other words, filter 300 comprises, like filter 200 of FIG. 2, at least two paths, each of which comprises at least two windings in series of different transformers, that is, separate. Thus, each transformer 220_j has its windings located in different paths 310_i. Transformers 220_j thus magnetically couple paths 310_i together.

As in the filter 200 of FIG. 2, due to the fact that the transformation ratios are different from 1, the optimum magnetic coupling between the paths is easier to obtain than in a filter where the transformation ratios would be equal to 1 and the magnetic coupling would be set by a specific configuration of the magnetic circuits 226_j of the transformers. The transformation ratios in the filter of FIG. 3 may then be selected to optimize the magnetic coupling between paths 310_i.

Preferably, for each path 310_i, the winding located in the transformer 220_j having the lowest index j is located on the side of node 132_i. For each path, the winding located in the transformer 220_j having the highest index j is located on the side of node 134_i. In other words, index j defines an order of the transformers and, in each path, the windings are arranged in the order of the transformers.

Preferably, each transformer has a phase point located on the side of nodes 132_i and a phase point located on the side of nodes 134_i. For example, in each path 310_i, winding 222_j has its phase point 232_j located on the side of node 132_i, and winding 224_j has its phase point 234_j located on the side of node 134_i. In other words, in each transformer 220_j, currents flowing in windings 222_j and 224_j in the direction of increasing indexes j cause magnetic flows of opposite direction in magnetic circuit 226_i.

The order of the windings along the paths and the positions of the phase points enable to obtain a magnetic coupling direction which optimizes the decrease of current variations in the paths.

Figure 4:
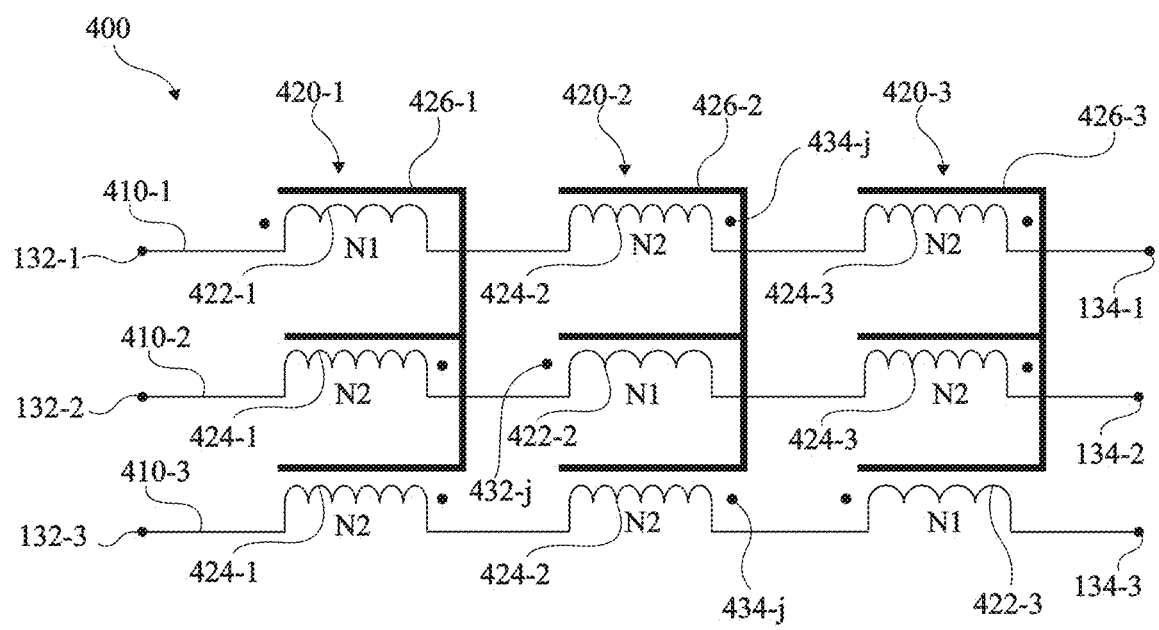
FIG. 4 schematically shows another embodiment of an inductive filter.

FIG. 4 schematically shows another embodiment of a polyphase inductive filter 400. The filter comprises a number N of paths 410_i coupling nodes 132_i respectively to nodes 134_i. The shown example corresponds to case N=3. Thus, paths 410_1, 410_2, and 410_3 couple respective nodes 132_1, 132_2, 132_3 to respective nodes 134_1, 134_2, 134_3.

Filter 400 comprises a plurality of transformers 420_j. Preferably, the number of transformers is equal to number N of paths. Each transformer 420_j comprises a winding 422_j and a plurality of windings 424_j. The number M of windings 424_j in each transformer is preferably smaller than or equal to N−1. The shown example corresponds to case M=2. In each transformer, the windings are magnetically coupled by magnetic circuits 426_j. Magnetic circuits 426_j are here symbolically shown and are for example toroidal. Each winding of a transformer is electrically in series with a winding of another transformer.

Each path comprises a series electric association of a winding 422_j and M windings 424_j. The windings of each path 410_i are located in separate transformers 420_j. In each transformer 420_j, the windings of the transformer are thus located in different paths 410_i. Thus, the transformers magnetically couple the paths to one another.

Each transformer 420_j has, between its winding 422_j and its windings 424_j, transformation ratios different from 1. The transformation ratios are preferably greater than 2 or smaller than 0.5, preferably greater than 3 or smaller than ⅓, preferably greater than 5 or smaller than ⅕. As in the previously-described embodiments, this enables to easily obtain the optimal magnetic coupling between paths 410_i. For a same performance level, the transformation ratios may be different from those defined hereabove for transformers 220_1 and 220_2.

In particular, transformers with a strong coupling, which, as previously mentioned, are easy to form, may be used. Preferably, each transformer 420_j has, between its winding 422_j and its windings 424_j, coupling coefficients greater than 0.9, preferably greater than 0.95.

Preferably, in each transformer, the transformation ratios between winding 422_j and windings 424_j are identical. Preferably, these transformation ratios have an identical value in all transformers.

Preferably, for each path 410_i, the winding located in each transformer 420_j is all the closer to node 132_i as index j is small. In other words, the windings are located in each path in the order of the transformers defined by index j.

Preferably, in each path 410_i, winding 422_j has its phase point 432_j on the side of node 132_i, and windings 424_j have their phase points 434_j on the side of node 134_i. As a variation, in each transformer, the side of the phase points of windings 424_j may be exchanged with the side of the phase point of winding 422_j. Thus, in each transformer 420_j, currents flowing through windings 422_j and 424_j in the direction of increasing indexes j cause magnetic flows of opposite directions in magnetic circuit 426_i.

Figure 5:
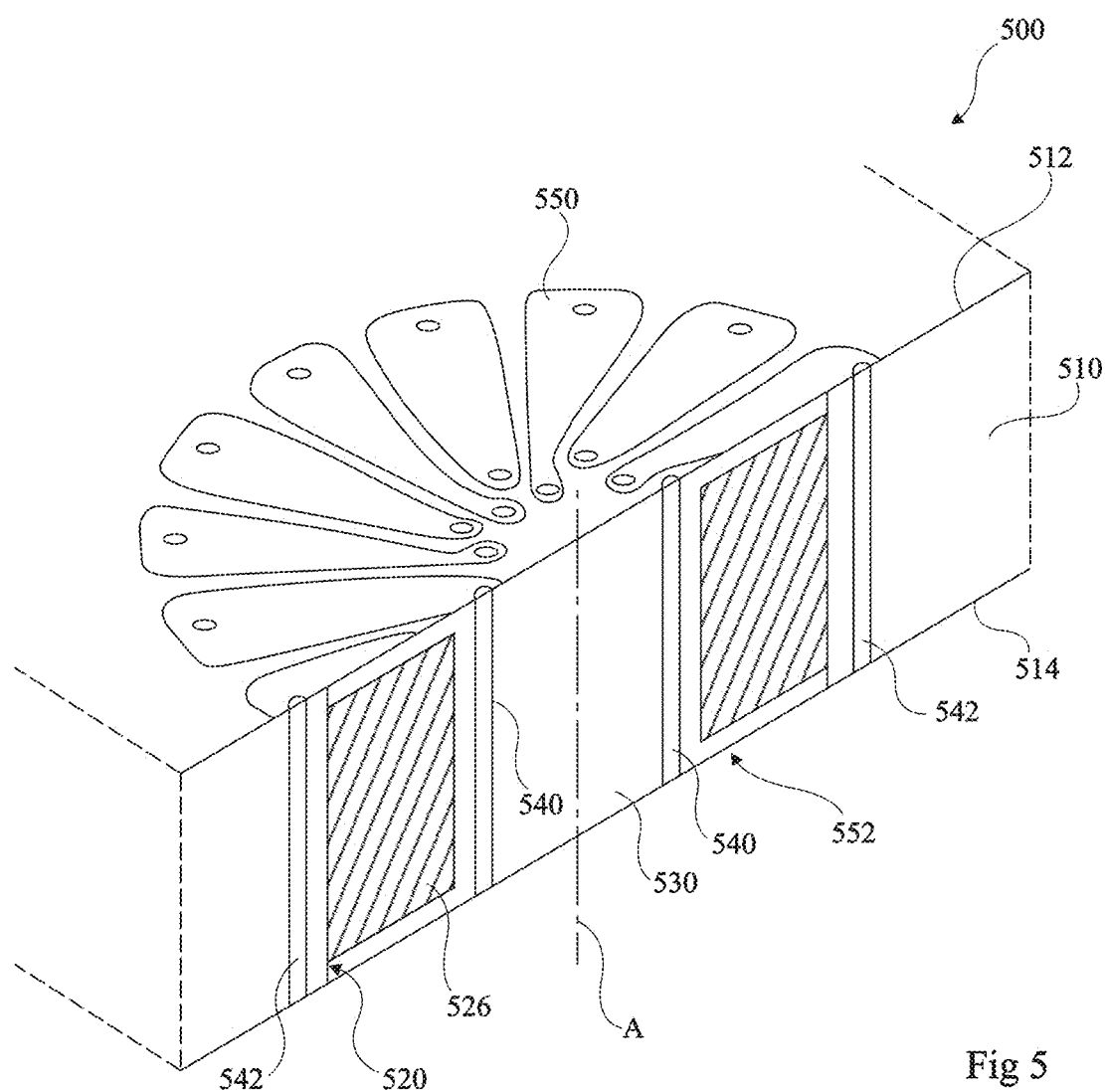
FIG. 5 shows a perspective cross-section view of an embodiment of a transformer of an inductive filter.

FIG. 5 shows a simplified perspective cross-section view of an embodiment of a transformer of an inductive filter. More precisely, the transformer is integrated in a printed circuit of PCB 500 type ("Printed Circuit Board").

The printed circuit comprises a substrate 510 in the form of an electrically insulating plate. Substrate 510 for example comprises epoxy resin and fiberglass.

As an example, to form the transformer, an opening 520, preferably circular, is formed in substrate 510. A toroidal magnetic circuit 526 is then positioned in opening 520. The circuit is positioned across the plate thickness and so that axis A of the torus (vertical in the drawing) is orthogonal to the main surfaces 512, 514 of the wafer. Preferably, magnetic circuit 526 comprises a powder of a ferromagnetic material such as iron or ferrite.

The cavity is then filled with an insulator 530, for example, epoxy resin. The thickness of the magnetic circuit is smaller than that of the plate, so that the magnetic circuit is electrically insulated. Circuit 526 is thus included in substrate 510.

The windings of the transformer are then formed, for example, at the same time as tracks of electronic circuits, not shown. The windings comprise vias 540 in the central opening of the torus, and vias 542 outside of the torus. Vias 540 and 542 are electrically conductive and thoroughly cross the substrate in the vertical direction. The windings further comprise tracks 550 located on surface 512 and extending, substantially radially with respect to axis A, from vias 540 to vias 542. Similarly, on surface 514, tracks 552 (not shown) extend substantially radially with respect to axis A, from vias 540 to vias 542. Tracks 550 and 552 are alternately coupled in series by vias 540 and 542. Each series association of a plurality of tracks 550 and 552 by a plurality of vias 540 and 542 forms a winding.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device comprising at least two transformers and at least two electric paths, wherein:
   each electric path comprises at least two windings electrically connected in series;
   each winding of one of the at least two transformers is electrically connected in series with a winding of another one of the at least two transformers;
   an input terminal of a first winding of each electric path is connected to an input terminal of said path;
   an output terminal of a last winding of each electric path is connected to an output terminal of said path; and
   the transformers have a transformation ratio different from one,
   wherein the input terminal of each electric path is coupled to the output terminal of said electric path via windings exclusively.

2. The device of claim 1, wherein at least two windings of a same transformer have different numbers of spirals.

3. The device of claim 1, wherein the coupling coefficient of each transformer is greater than 0.9.

4. The device of claim 1, wherein phase points of the windings are magnetically opposite.

5. The device of claim 1, comprising at least two paths, each of which comprises at least two windings in series of different transformers.

6. The device of claim 5, wherein phase points of at least two windings of a same path are magnetically opposite.

7. The device of claim 5, wherein the number of transformers is equal to the number of paths.

8. The device of claim 5, wherein the number of windings in series per path is equal to the number of windings per transformer.

9. The device of claim 5, wherein each path represents a phase of an AC voltage.

10. The device of claim 1, wherein each transformer comprises a toroidal magnetic circuit.

11. The device of claim 1, comprising a PCB-type substrate having magnetic circuits of the transformers included therein.

12. The device of claim 11, wherein said windings are each defined by conductive tracks located on the opposite surfaces of the substrate and series-coupled by vias.

13. A polyphase inductive filter comprising the device of claim 1.

14. A switched-mode converter comprising at least one device of claim 1.

* * * * *